United States Patent
Kurita

(10) Patent No.: US 7,858,954 B2
(45) Date of Patent: Dec. 28, 2010

(54) APPARATUS AND METHOD FOR IRRADIATING ENERGY BEAM

(75) Inventor: Tsuyoshi Kurita, Tokyo (JP)

(73) Assignee: Lintec Corporation, Tokyo (JP)

( * ) Notice: Subject to any disclaimer, the term of this patent is extended or adjusted under 35 U.S.C. 154(b) by 229 days.

(21) Appl. No.: 11/914,713

(22) PCT Filed: May 10, 2006

(86) PCT No.: PCT/JP2006/309367
§ 371 (c)(1),
(2), (4) Date: Dec. 17, 2008

(87) PCT Pub. No.: WO2006/126390
PCT Pub. Date: Nov. 30, 2006

(65) Prior Publication Data
US 2009/0302238 A1    Dec. 10, 2009

(30) Foreign Application Priority Data
May 24, 2005   (JP)   ................ 2005-151091

(51) Int. Cl.
*A61N 5/00*   (2006.01)

(52) U.S. Cl. .................................................. 250/492.2
(58) Field of Classification Search ............. 250/492.2, 250/492.1; 430/141, 156; 428/343, 355 AC
See application file for complete search history.

(56) References Cited

U.S. PATENT DOCUMENTS

| 4,347,300 | A | * | 8/1982 | Shimazu et al. | ............. | 430/156 |
| 7,691,925 | B2 | * | 4/2010 | Amano et al. | ................. | 524/99 |

FOREIGN PATENT DOCUMENTS

JP   2004 281430 A   10/2004

* cited by examiner

*Primary Examiner*—Kiet T Nguyen
(74) *Attorney, Agent, or Firm*—Norris McLaughlin & Marcus, P.A.

(57) ABSTRACT

An energy beam irradiating apparatus and/or method which, when peeling off an adhesive sheet having an energy radiation curable adhesive and stuck to a wafer, has an ultraviolet ray irradiated to the adhesive sheet, and on an occasion of reducing its adhesive strength. The wafer with the adhesive sheet is suction-held with a supporting member, and the ultraviolet ray is irradiated from an UV lamp in this state. On this occasion, a nitrogen gas N is ejected from a gas discharge area adjacent to a wafer suction-holding area of the supporting member.

12 Claims, 4 Drawing Sheets

(a)

(b)

(a)

(b)

(c)

(d)

APPARATUS AND METHOD FOR IRRADIATING ENERGY BEAM

TECHNICAL FIELD

The present invention relates to an apparatus and method for irradiating an energy beam, which irradiate an energy beam to an adhesive sheet stuck on an adherend via an energy radiation curable adhesive.

BACKGROUND ART

As an energy beam irradiating apparatus of this type, for example, the one with the structure of Patent Document 1 is known. In the energy beam irradiating apparatus of the same Document, on curing an ultraviolet radiation curable adhesive, in order to prevent oxygen in the atmosphere from inhibiting its ultraviolet radiation cure, a wafer (1) is disposed in a processing chamber (20) which is closed with a shielding plate (21) and of which inside atmosphere is replaced with a nitrogen gas, and thereafter, ultraviolet ray are irradiated to an adhesive tape (2) stuck to the wafer (1) to reduce its adhesive strength, so that the adhesive tape (2) can be easily peeled off. The reference numerals in the above described parentheses are used in Patent Document 1. The same thing also applies hereinafter.

However, according to the energy beam irradiating apparatus of Document 1, the structure in which the wafer (1) is disposed in the processing chamber (20) of which inside atmosphere is replaced with a nitrogen gas is adopted on the occasion of ultraviolet ray irradiation, and therefore, it takes time to replace the inside atmosphere of the processing chamber (20) with the nitrogen gas, which reduces the processing performance of the entire equipment. There are also the problems of requiring a large amount of nitrogen gas to fill the processing chamber (20) with the nitrogen gas to increase the consumption amount of the gas, and the problem of necessity of securing the installation space of the processing chamber (20).

Patent Document 1: Japanese Patent Laid-Open No. 2004-281430

DISCLOSURE OF THE INVENTION

Problem to be Solved by the Invention

The present invention is made in view of the above described problems, and it is an object of the present invention to provide an apparatus and method for irradiating an energy beam that are preferable for enhancement of the processing performance of the equipment, reduction in gas consumption, and reduction in an equipment installation space.

Means for Solving the Problem

In order to attain the above-described object, an energy beam irradiating apparatus according to the present invention is an energy beam irradiating apparatus that, when peeling off an adhesive sheet having an energy radiation curable adhesive stuck on an adherend, irradiates an energy beam to the adhesive to cure the adhesive and reduce an adhesive strength, and the aforesaid energy beam irradiating apparatus has a supporting member that suction-holds the aforesaid adherend, and energy beam irradiating means that irradiates the energy beam to the adhesive sheet, and the aforesaid supporting member has a gas discharge area adjacent to a suction-holding area for the adherend.

In the energy beam irradiating apparatus of the present invention, ejection of a gas from the gas discharge area may be performed in a sealed space.

In the energy beam irradiating apparatus according to the present invention, the adherend may be a semiconductor wafer.

In the energy beam irradiating apparatus according to the present invention, a gas which ejects from the gas discharge area may be an inert gas.

In the energy beam irradiating apparatus according to the present invention, ejection of a gas from the gas discharge area may be forcibly directed to an inside of the adherend.

In the energy beam irradiating apparatus according to the present invention, the energy beam may be an ultraviolet ray, and the energy radiation curable adhesive may be an ultraviolet radiation curable adhesive.

In order to attain the above described object, an energy beam irradiating method of the present invention is an energy beam irradiating method for, when peeling off an adhesive sheet having an energy radiation curable adhesive stuck to an adherend, irradiating an energy beam to an adhesive to cure the adhesive and reduce an adhesive strength, and the aforesaid energy beam irradiating method includes the step of ejecting a gas from a gas discharge area adjacent to a suction-holding area for the adherend, when energy beam irradiating means irradiates the energy beam to the adhesive with a supporting member suction-holding the adherend.

In the energy beam irradiating method according to the present invention, the ejection of the gas from the gas discharge area may be performed in a sealed space.

In the energy beam irradiating method according to the present invention, the adherend may be a semiconductor wafer.

In the energy beam irradiating method according to the present invention, the gas ejecting from the gas discharge area may be an inert gas.

In the energy beam irradiating method according to the present invention, the ejection of the gas from the gas discharge area may be forcibly directed to an inside of the adherend.

In the energy beam irradiating method according to the present invention, the energy beam may be an ultraviolet ray, and the energy radiation curable adhesive may be an ultraviolet radiation curable adhesive.

Effect of the Invention

In the present invention, the construction in which the gas is ejected from the gas discharge area adjacent to the suction-holding area for the adherend is adopted as described above, and therefore, cure inhibition by oxygen in the atmosphere can be prevented, in addition to which, charge of the gas is not required on the occasion of irradiation of the energy beam such as an ultraviolet ray and the like. Therefore, charging time of the gas is not required, and enhancement of the processing performance of the entire equipment and reduction in gas consumption amount can be achieved. A processing chamber or the like for charging the gas is not required, and therefore, the equipment installation space can be correspondingly reduced.

BEST MODE FOR CARRYING OUT THE INVENTION

Hereinafter, a preferred embodiment for carrying out the present invention will be described in detail with reference to the accompanying drawings.

FIG. 1 is a plane view of a semiconductor manufacturing equipment to which an energy beam irradiating apparatus or an energy beam irradiating method of the present invention is applied, FIGS. 2(*a*) and 2(*b*) are explanatory views of a supporting member which constructs the energy beam irradiating apparatus applied to the semiconductor manufacturing equipment in FIG. 1, FIGS. 3(a) and 3(b) are explanatory views of a mechanism of the energy beam irradiating apparatus in FIGS. 2(a) and 2(b), and FIGS. 4(a) to 4(d) are explanatory views of a process of the semiconductor manufacturing equipment in FIG. 1.

In a semiconductor manufacturing equipment 1 in FIG. 1, a manufacturing method for performing dicing of a semiconductor wafer (hereinafter, abbreviated as "wafer W") first (see FIG. 4(a)), and thereafter, performing back grind for the diced wafer W (see FIG. 4(b)), a so-called pre-dicing method is adopted. In this manufacturing method, the diced wafer W (see FIG. 4(a)) is subjected to back grind processing in a back grind stage S1 (see FIG. 4(b)) and is formed to be of a desired thickness. Before the back grind processing is performed, a protection sheet T is stuck to a circuit surface of the wafer W via an ultraviolet radiation curable adhesive A. Then, by the back grind processing, the wafer W is divided into individual pieces to be an aggregate of a plurality of chips C (see FIG. 4(c) and 4(d)). The wafer W which is divided into a plurality of chips C by the back grind is transported to a peeling stage S2, and the protection sheet T is peeled off from the wafer W in the stage S2 (see FIG. 4(d)).

As in FIG. 1, a UV lamp 2 as energy beam irradiating means is placed partway along a wafer transport passage L from the back grind stage SI to the peeling stage S2. The UV lamp 2 reduces adhesive strength by curing the above described adhesive A which bonds the wafer W and the protection sheet T with ultraviolet rays so as to be able to peel off the protection sheet T easily.

When the wafer W is transported along the wafer transport passage L, the wafer W is suction-held by a supporting member 3. The supporting member 3 has a suction part 5 and a discharge part 6 formed by a porous member integrally provided on an undersurface of a support base plate 4 as shown in FIGS. 2A and 2B. The suction part 5 is formed to have substantially the same diameter as the wafer W, and its undersurface is an area which suction-holds the wafer W (hereinafter, called "wafer suction-holding area SA"). The discharge part 6 is formed into a ring shape so as to surround an outer periphery of the suction part 5, and forms a gas discharge area GA which is adjacent to the wafer suction-holding area SA. An outer peripheral surface of the discharge part 6 is covered with a ring-shaped side plate 4-1 which is provided integrally with the support base plate 4.

The support base plate 4 is provided with a gas feed hole 7 and a suction hole 8. A feed hose 9 of an inert gas (nitrogen gas N in this embodiment) is connected to one end of the gas feed hole 7 to feed a nitrogen gas N from a gas pump not shown, and the other end of the gas feed hole 7 opens to a surface (porous surface) of the discharge part 6. Meanwhile, a suction hose 10 is connected to one end of the suction hole 8 to suck air by a vacuum pump not shown, and the other end of the suction hole 8 opens to a surface (porous surface) of the suction part 5.

The suction part 5 is constructed by the porous member, and when suction through the suction hose 10 is performed, a suction force occurs to the entire wafer suction-holding area SA of the supporting member 3. By this suction force, the wafer W divided into a plurality of chips is suction-held by the supporting member 3. The discharge part 6 is also constructed by the porous member as described above, and when supply of the nitrogen gas N is performed through the feed hose 9, the nitrogen gas N ejects from the gas discharge area GA adjacent to the above described wafer suction-holding area SA, specifically, the undersurface of the discharge part 6 through the gas feed hole 7 and the discharge part 6.

The wafer W which is suction-held as described above is the aggregate of a plurality of individual chips C, and therefore, a suction force by the suction hose 10 also occurs to an outer peripheral surface of the wafer W through a gap G between the chips C shown in FIGS. 3(a) and 3(b) (this gap G is formed as the groove cut in dicing in a pre-dicing method). Therefore, the nitrogen gas N which ejects from the discharge part 6 as described above is sucked from the outer peripheral surface of the wafer W which is suction-held as in FIGS. 3(a) and 3(b), and forcibly enters the inside of the wafer W through the gap G between the chips C. The nitrogen gas N which enters the inside of the wafer W is finally sucked by the suction hose 10 through the inside of the suction part 5 and the suction hole 8. Therefore, curing inhibition in the portions where the ultraviolet radiation curable adhesive contacts the atmosphere, especially in the gap G between the chips C can be effectively prevented, and the adhesive does not remain on the wafer at the time of peeling off the protection sheet T shown in FIG. 4(d).

Next, an action of the semiconductor manufacturing equipment in FIG. 1, and an action and operation of the apparatus and method for irradiating an energy beam of the present invention will be described.

In the semiconductor manufacturing equipment 1 in FIG. 1, the wafer W with the protection sheet T after dicing (see FIG. 4(a)) is transported to the back grind stage S1, and back grind of the wafer W is performed on the same stage S1 (see FIG. 4(b)). When the back grind is completed, the grind surface of the wafer W is suction-held by the supporting member 3 mounted to a tip end of a multi-articulated robot 11 as shown in FIGS. 3(a) and 3(b).

The wafer W with the protection sheet T which is suction-held as described above is transported to the peeling stage S2 by the articulated robot 11 with the protection sheet T down. Since on this occasion, the wafer W with the protection sheet T is set to pass above the UV lamp 2, ultraviolet rays are irradiated to the protection sheet T from the UV lamp 2, the adhesive A which bonds the wafer W and the protection sheet T is cured, and the adhesive strength is reduced, whereby the protection sheet T is in the easily peelable state. Then, the wafer W with the protection sheet T which is transported to the peeling stage S2 is placed so that the protection sheet T is the top surface, and the protection sheet T is peeled off from the wafer W in the state where the wafer W is sucked (see FIG. 4(d)).

When the wafer W with the protection sheet T passes above the UV lamp 2 as described above, supply of the nitrogen gas N is performed through the feed hose 9 as shown in FIGS. 3(a) and 3(b) and FIG. 4(c), and with the help of the suction force by the suction hose 10, the nitrogen gas N is sucked from the outer peripheral surface of the wafer W which is suction-held as shown in FIGS. 3(a) and 3(b), and forcibly enters the inside of the wafer W through each gap G between the chips C. Since the active oxygen which inhibits cure of the adhesive A on the outer periphery and in the inside of the wafer W is removed by the nitrogen gas N which ejects as above, the adhesive A can be sufficiently cured, and the problem caused by undercure of the adhesive A, for example, the problem that the adhesive A remains on the outer periphery of the wafer W and the outer periphery of the individual chips C after peeling off the protection sheet T and the like can be effectively prevented.

According to the energy beam irradiating apparatus of the above described embodiment, the construction in which the nitrogen gas N is ejected from the gas discharge area GA adjacent to the wafer suction-holding area SA is adopted, and therefore, charge of the nitrogen gas N is not required on ultraviolet ray irradiation. Thus, charging time of the nitrogen gas N is not required, and enhancement of the processing performance of the entire semiconductor manufacturing equipment and reduction in consumption amount of the nitrogen gas N can be achieved. The processing chamber or the like for charging the nitrogen gas N is not required, and therefore, the equipment installation space can be reduced correspondingly. Further, during transportation of the wafer W, ejection of the nitrogen gas N and ultraviolet ray irradiation to the protection sheet T are performed, and therefore, there is the advantage of high operation efficiency.

An example using the nitrogen gas N is described in the above described embodiment, but the present invention is not limited to this, and inert gases such as a helium gas, and an argon gas other than a nitrogen gas N may be used.

The example using the ultraviolet radiation curable adhesive as an energy radiation curable adhesive is described in the above described embodiment, but adhesives that cure with energy beams other than ultraviolet rays may be applied. In this case, energy beam irradiating means corresponding to the applied energy beam is used instead of the above described UV lamp 2.

In the above described embodiment, the construction in which the nitrogen gas N is ejected from the gas discharge area GA adjacent to the wafer suction-holding area SA during transportation of the wafer W which is suction-held with the supporting member 3 is adopted, but such ejection of the nitrogen gas N may be performed in a sealed space. Even in the case of adopting such a sealed space, the nitrogen gas N is also discharged from the gas discharge area GA adjacent to the wafer suction-holding area SA, and the construction in which the nitrogen gas N is charged into the sealed space is not adopted. Accordingly, such a sealed space does not required for charging the nitrogen gas N, and therefore, the sealed space may be simple.

BRIEF DESCRIPTION OF THE DRAWINGS

FIG. 2(a) is a plane view of the supporting member, and FIG. 2(b) is a sectional view taken along the line B to B in FIG. 2(a);

FIG. 3(a) is an explanatory sectional view of a state in which a wafer is suction-held with the supporting member and ultraviolet ray irradiation, and FIG. 3(b) is a sectional view taken along the line B to B in FIG. 3(a)

Figure 1:
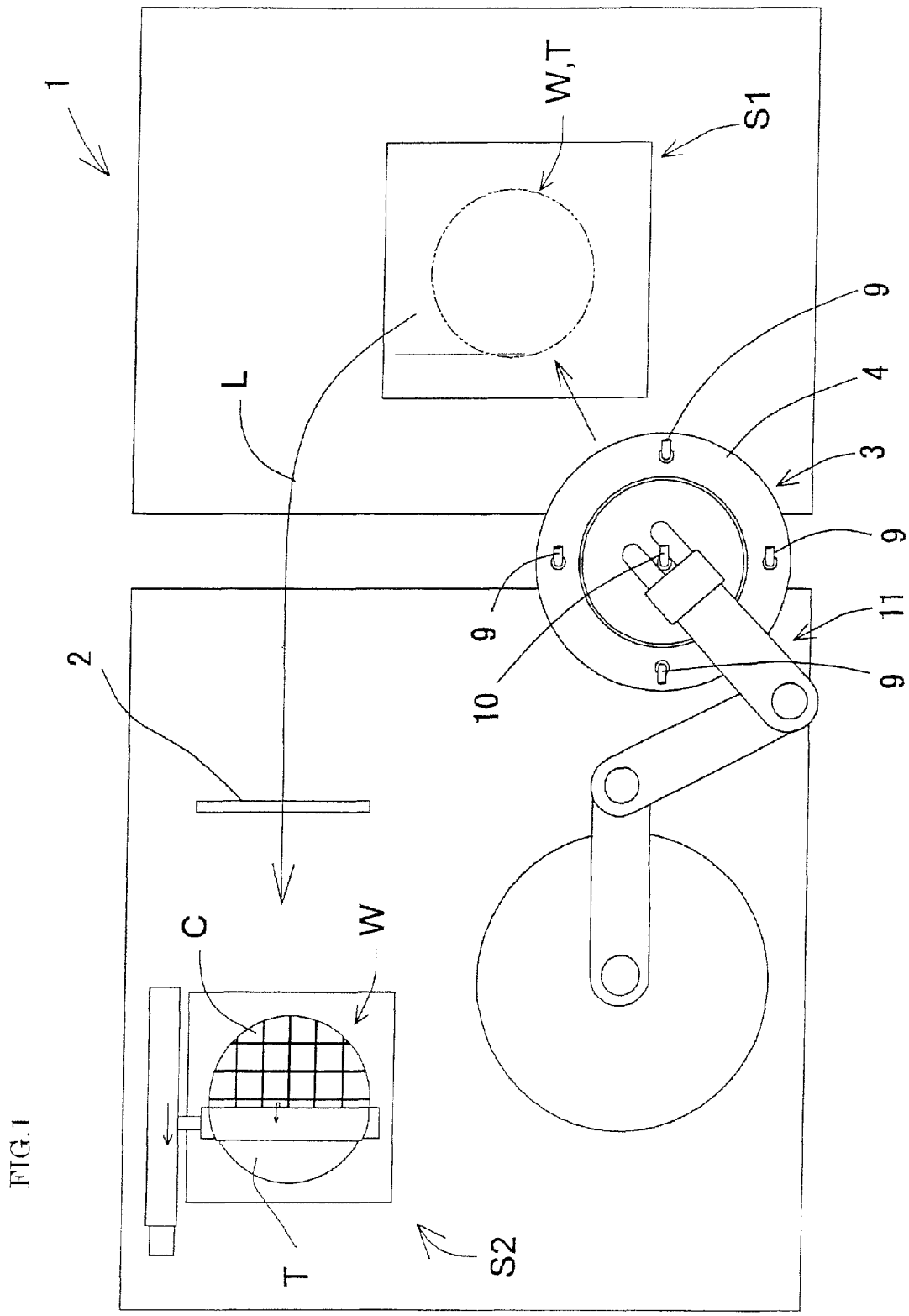
FIG. 1 is a plane view of a semiconductor manufacturing equipment to which an apparatus and method for irradiating an energy beam of the present invention are applied.
Figure 2:
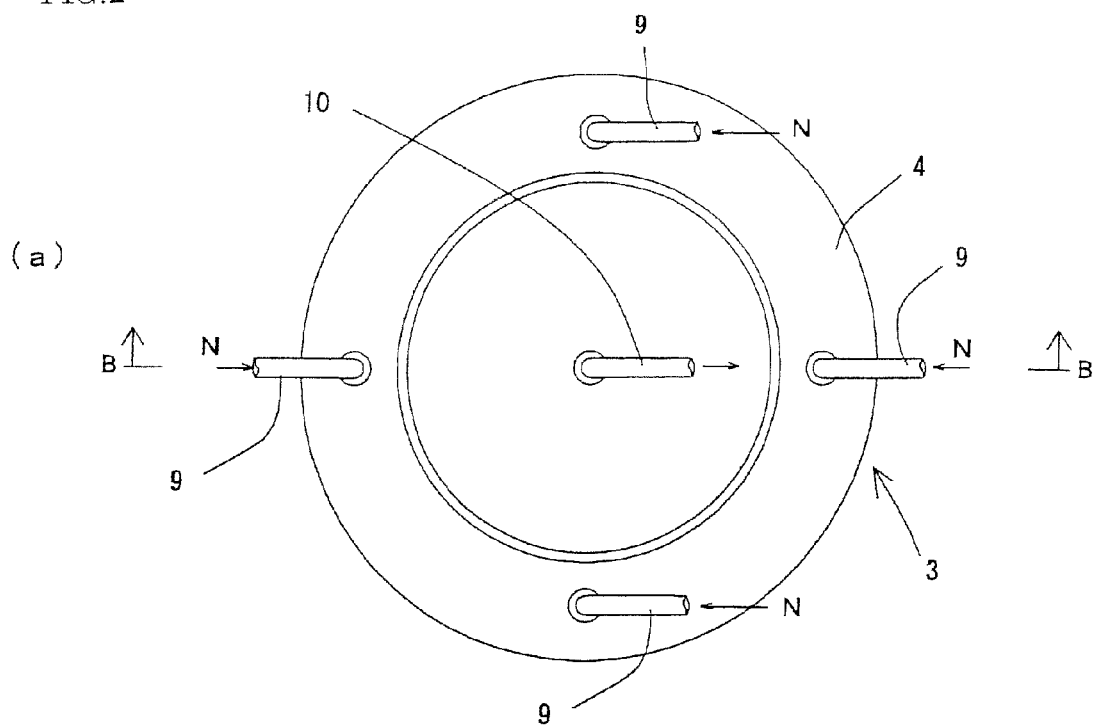
FIGS. 2(a) and 2(b) are explanatory views of a supporting member which constructs the energy beam irradiating apparatus applied to the semiconductor manufacturing equipment in FIG. 1.
Figure 2:
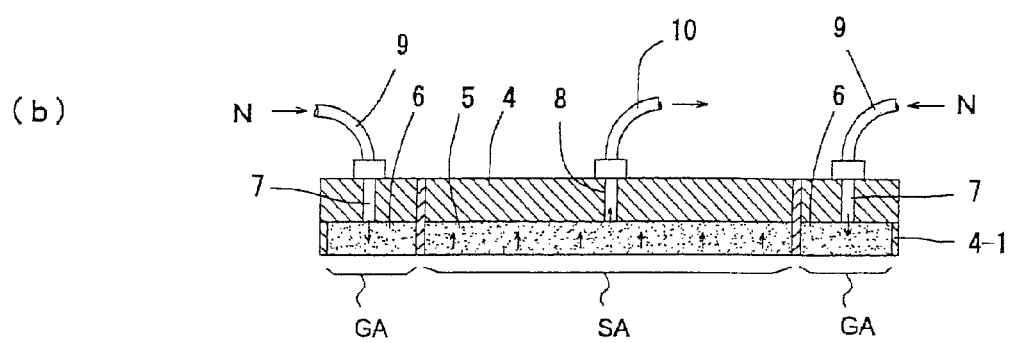
Figure 3:
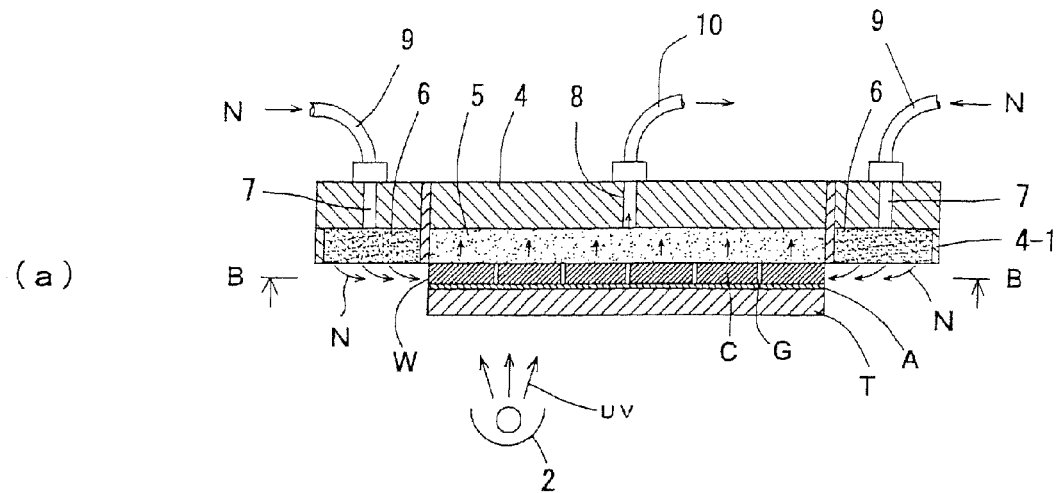
FIGS. 3(a) and 3(b) are explanatory views of a mechanism of the energy beam irradiating apparatus in FIGS. 2(a) and 2(b)
Figure 3:
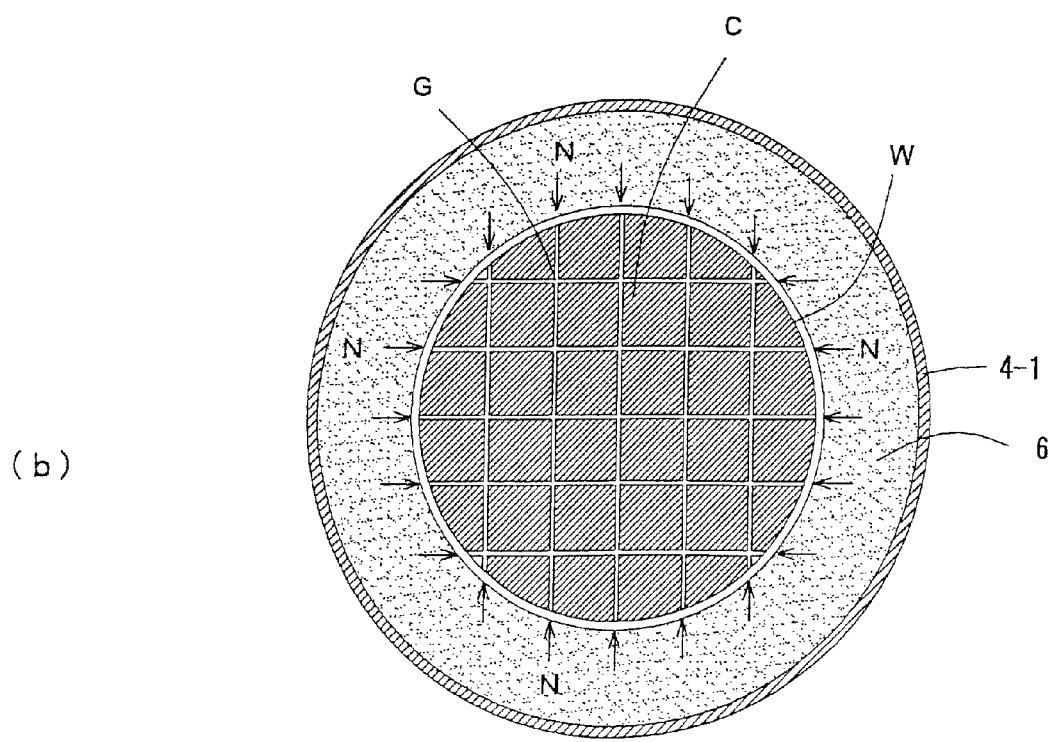
Figure 4:
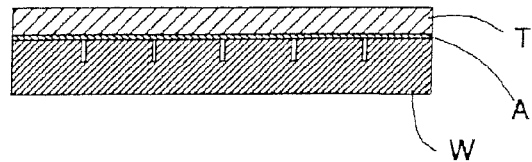
FIGS. 4(a) to 4(d) are explanatory views of a process of the semiconductor manufacturing equipment in FIG. 1.
Figure 4:
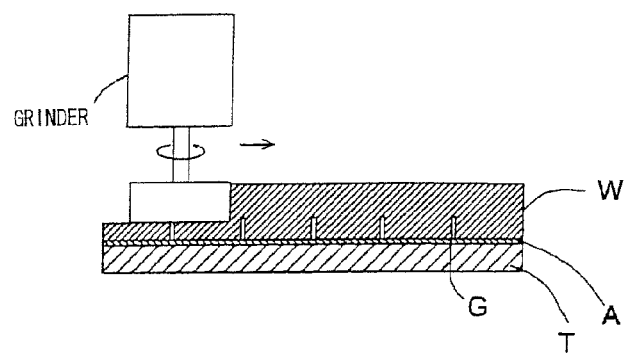
Figure 4:
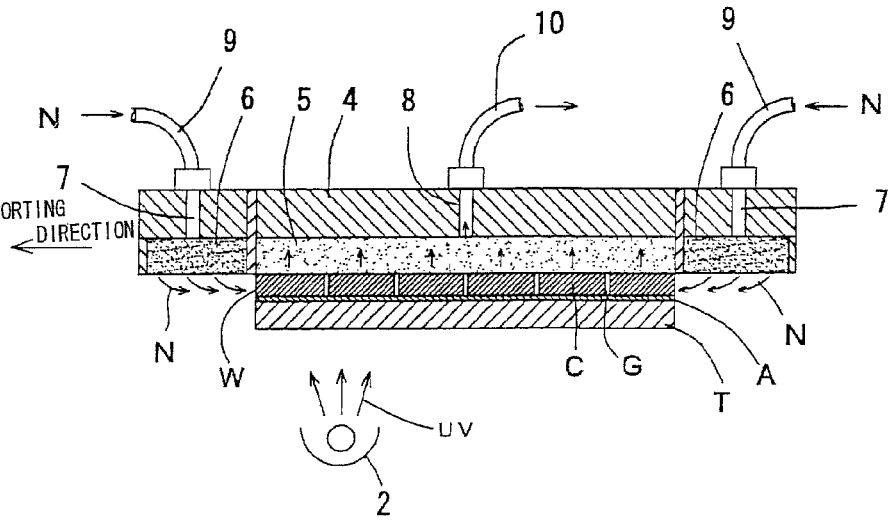
Figure 4:
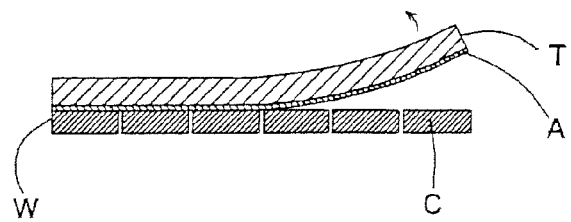

2: UV lamp (energy beam irradiating means)
3: supporting member
GA: gas discharge area
SA: wafer suction-holding area
A: adhesive
T: protection sheet (adhesive sheet)
W: wafer (adherend)

The invention claimed is:

1. An energy beam irradiating apparatus which, when peeling off an adhesive sheet having an energy radiation curable adhesive stuck to an adherend, irradiates an energy beam to the adhesive to cure the adhesive and reduce an adhesive strength,
the energy beam irradiating apparatus, comprising:
a supporting member which suction-holds the adherend; and
energy beam irradiating means which irradiates the energy beam to the adhesive sheet,
wherein the supporting member has
a gas discharge area adjacent to a suction-holding area for the adherend.

2. The energy beam irradiating apparatus according to claim 1, wherein ejection of a gas from the gas discharge area is performed in a sealed space.

3. The energy beam irradiating apparatus according to claim 1, wherein the adherend is a semiconductor wafer.

4. The energy beam irradiating apparatus according to claim 1, wherein a gas which ejects from the gas discharge area is an inert gas.

5. The energy beam irradiating apparatus according to claim 1, wherein ejection of a gas from the gas discharge area is forcibly directed to an inside of the adherend.

6. The energy beam irradiating apparatus according to claim 1,
wherein the energy beam is an ultraviolet ray, and
the energy radiation curable adhesive is an ultraviolet radiation curable adhesive.

7. An energy beam irradiating method for, when peeling off an adhesive sheet having an energy radiation curable adhesive stuck to an adherend, irradiating an energy beam to the adhesive to cure the adhesive and reduce an adhesive strength,
the energy beam irradiating method, comprising the step of ejecting a gas from a gas discharge area adjacent to a suction-holding area for the adherend, when energy beam irradiating means irradiates the energy beam to the adhesive with a supporting member suction-holding the adherend.

8. The energy beam irradiating method according to claim 7, wherein the ejection of the gas from the gas discharge area is performed in a sealed space.

9. The energy beam irradiating method according to claim 7, wherein the adherend is a semiconductor wafer.

10. The energy beam irradiating method according to claim 7, wherein a gas ejecting from the gas discharge area is an inert gas.

11. The energy beam irradiating method according to claim 7, wherein ejection of a gas from the gas discharge area is forcibly directed to an inside of the adherend.

12. The energy beam irradiating method according to claim 7,
wherein the energy beam is an ultraviolet ray, and
the energy radiation curable adhesive is an ultraviolet radiation curable adhesive.

* * * * *